United States Patent
Grodzki et al.

(10) Patent No.: US 10,989,782 B2
(45) Date of Patent: Apr. 27, 2021

(54) METHOD AND MAGNETIC RESONANCE IMAGING DEVICE FOR PROVIDING AN MR-IMAGE, COMPUTER PROGRAM, AND COMPUTER-READABLE STORAGE MEDIUM

(71) Applicant: Siemens Healthcare GmbH, Erlangen (DE)

(72) Inventors: David Grodzki, Erlangen (DE); Stephan Biber, Erlangen (DE); Kun Zhou, Shenzhen (CN); De He Weng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/721,170

(22) Filed: Dec. 19, 2019

(65) Prior Publication Data
US 2020/0200849 A1   Jun. 25, 2020

(30) Foreign Application Priority Data
Dec. 19, 2018  (CN) .................. CN201811560879.X

(51) Int. Cl.
*G01R 33/565*   (2006.01)
(52) U.S. Cl.
CPC .............................. *G01R 33/56572* (2013.01)
(58) Field of Classification Search
CPC ............................................. G01R 33/56572
See application file for complete search history.

(56) References Cited

U.S. PATENT DOCUMENTS

| | | | |
|---|---|---|---|
| 4,876,507 A * | 10/1989 | Van Vaals | G01R 33/4625 324/307 |
| 2009/0302845 A1 | 12/2009 | Biber | |
| 2013/0101198 A1 | 4/2013 | Grodzki | |

FOREIGN PATENT DOCUMENTS

DE   102017220697 A1   5/2019

OTHER PUBLICATIONS

Grodzki D. M. et al; "Correcting slice selectivity in hard pulse sequences"; Journal of Megnetic Resonance; vol. 214; pp. 61-67; DOI: 10.1016/j.jmr.2011.10.005; 2012.

* cited by examiner

*Primary Examiner* — G. M. A Hyder
(74) *Attorney, Agent, or Firm* — Schiff Hardin LLP

(57) ABSTRACT

A method and a magnetic resonance imaging device, and a corresponding computer readable storage medium. The method includes acquiring a distortion function describing a frequency dependence of an amplitude or phase of an MR-signal received by a receiver part of the MRI-device, Fourier transforming K-space data acquired using this receiver part to image space data, generating compensated image space data by compensating for the frequency dependence by dividing the image space data or image space data derived therefrom in image space by the distortion function, and providing the MR-image as the compensated image space data or reconstructed therefrom.

9 Claims, 2 Drawing Sheets

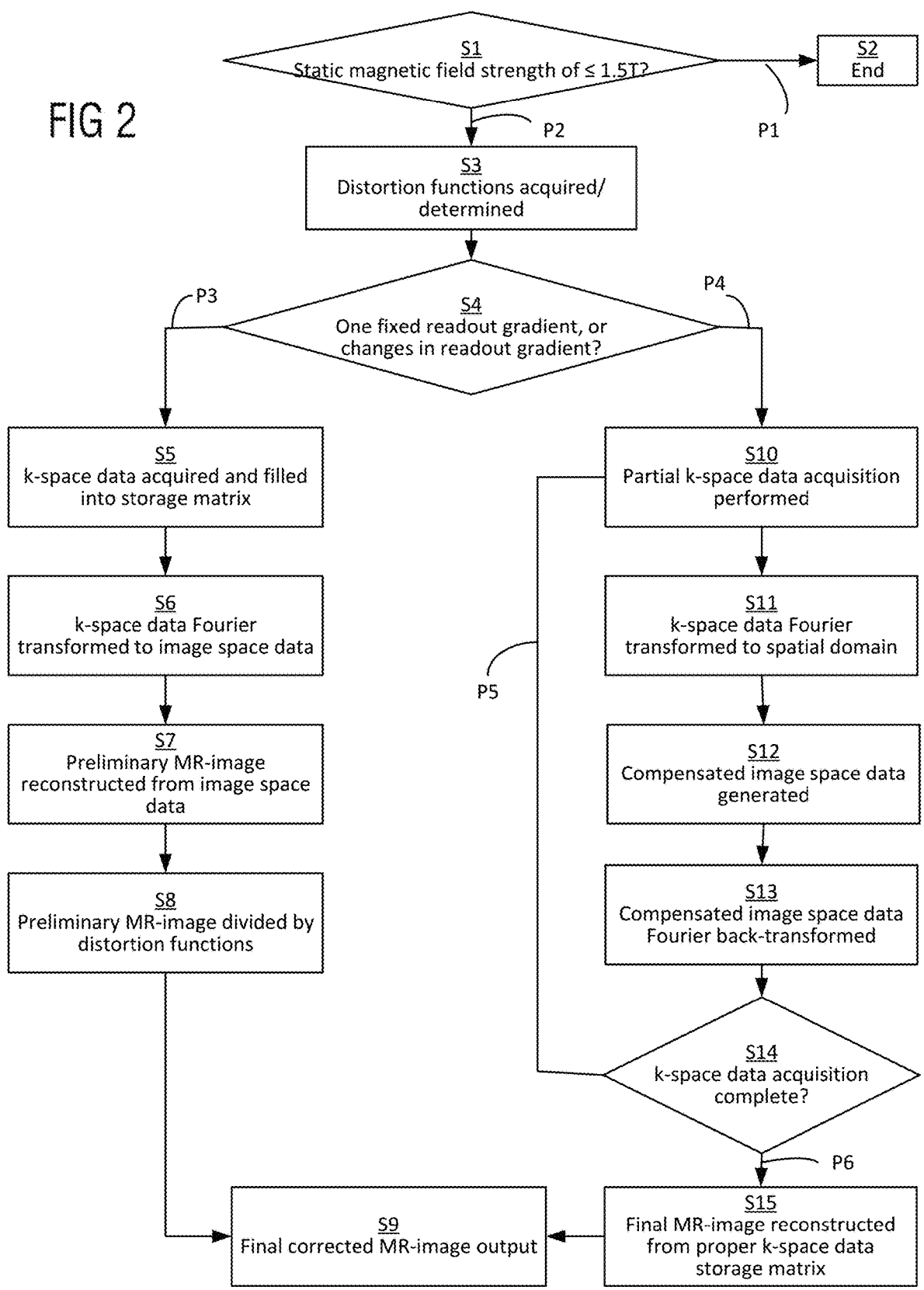

METHOD AND MAGNETIC RESONANCE IMAGING DEVICE FOR PROVIDING AN MR-IMAGE, COMPUTER PROGRAM, AND COMPUTER-READABLE STORAGE MEDIUM

FIELD OF THE DISCLOSURE

The present disclosure relates to a method and a magnetic resonance imaging device for providing an MR-image. Furthermore, the present disclosure relates to a corresponding computer program or computer program product, and a corresponding computer readable storage medium.

BACKGROUND

The field of medical imaging constantly strives to improve the image quality of images of subjects, such as patients. In magnetic resonance imaging, or MR-imaging for short, it is a well-known problem that, especially on low field systems, meaning systems or devices with a static magnetic field strength of 1.5 T or less, a bandwidth of sending and receiving parts, for example antennas or coils, can be substantially smaller than on high field systems, that is, on systems or devices that produce or operate at static magnetic field strengths of more than 1.5 T. In particular for the receiving part, that is, a part or an antenna or coil assembly used for receiving or detecting or measuring MR-signals or echoes, this may lead to different or varying amplitude and phase behaviours or responses of the measured signal or echo or of the receiving part depending on the frequency of the signal. This in turn can for example result in an uneven image signal and/or an uneven contrast across a resulting final MR-image. This problem has so far not been solved in available magnetic resonance imaging methods and devices. It might somehow be possible to at least partially overcome the problem through more sophisticated hardware. This would, however, result in significantly increased development and design effort, and corresponding costs.

SUMMARY

It is an object of the present disclosure to enable an improved image quality of MR-images, that is, of magnetic resonance images. This object is achieved by the subject matter of the independent claims. Advantageous embodiments with expedient developments of the present disclosure are indicated in the dependent claims as well as in the description and in the drawings.

A method according to the present disclosure for providing an MR-image comprises multiple steps. One step of this method comprises acquiring at least one distortion function that describes or characterizes a frequency dependence of an amplitude and/or a phase of an MR-signal received by a receiver part of an MRI-device, that is, a magnetic resonance imaging device. The receiver part can, in particular, be or comprise at least one receiving antenna or coil. The MR-signal received by the receiving part can later be used to generate or reconstruct the MR-image at least in part by using image generation or image reconstruction techniques and methods well-known in the art. Another step of the method according to the present disclosure comprises acquiring k-space data measured using the receiver part. This k-space data can describe or encode image information about an imaged subject, such as a patient or a part of a patient. The k-space data can be one instance of the mentioned MR-signal or carried by such an MR-signal received and measured using the receiver part. The k-space data can preferably be acquired after the distortion function has been acquired. It can, however, also be possible to acquire the k-space data first and then acquire or determine the distortion function.

Acquiring the distortion function and/or the k-space data can comprise a respective actual measurement. It can, however, additionally or alternatively comprise retrieving or accessing the distortion function and/or the k-space data, respectively, from a provided data store on which the distortion function and/or the k-space data is stored. The method according to the present disclosure can thus be applicable for live-imaging as well as processing or reprocessing pre-existing k-space data.

Another step of the method according to the present disclosure comprises Fourier transforming the k-space data to image space data, that is, from the frequency domain to the spatial domain or image domain. Another step of the method comprises generating compensated image space data by compensating for the frequency dependence in the image space data by dividing the image space data or image space data derived therefrom in image space by the distortion function. As a further step of the method according to the present disclosure the MR-image is provided as the compensated image space data or the MR-image is reconstructed from the compensated image space data and then provided or output.

Before, in between, and/or after the above-mentioned process steps other additional processing steps may be performed. Such additional processing steps can, for example, include transmitting and/or storing any of the mentioned data as well as for example filtering, noise reduction, artefact correction, and/or the like. For these possible additional steps standard techniques know in the art can be used.

The method according to the present disclosure can be carried out using a magnetic resonance imaging device, which will be described in further detail down below, and/or a data processing device, which can comprise acquisition means for acquiring the distortion function, and the k-space data, as well as processing means for Fourier transforming the k-space data, for generating the compensated image space data, and for providing the MR-image. The acquisition means can comprise the actual magnetic resonance imaging assembly and/or a data interface for retrieving the respective data.

The present disclosure in effect describes a post-processing method, enabling a complete compensation, that is, a complete correction of the above-mentioned frequency dependence of received or measured MR-signal amplitudes and/or phases. Mathematically, said frequency dependence, that is, variations in a received or measured signal amplitude and/or phase in dependence on the frequency of the signal, can be seen as a distortion of the respective received or measured MR-signal or a corresponding sent signal in the image domain. Depending on an MR-frequency influenced by an effective magnetic field strength each excited spin of the imaged subject experiences a different distortion. The MR-frequency with regards to this problem is given by a position of the respective spin in the spatial or image domain, and an overlaying readout gradient used during signal acquisition, that is, during acquisition of the k-space data. The present disclosure recognises that therefore the problem can advantageously be solved in the image domain or image space. Also, the problem is dependent on the readout gradient used for each readout, that is, for each full or partial acquisition of the k-space data. Acquiring the k-space data, that is, each k-space data acquisition, can in terms of the present disclosure refer to acquiring or measuring one or multiple k-space lines or a complete k-space dataset for the respective MR-image.

The present disclosure describes a generic method to correct for the influence of frequency dependencies on the receiving side. Advantageously, the present disclosure achieves this correction or compensation without the need for additional hardware. The present disclosure can advantageously very easily be implemented or integrated with existing standard image acquisition or construction processes and devices. Since the present disclosure enables a complete compensation or mitigation of the frequency dependencies, the above-mentioned uneven image signal and/or uneven contrast across the MR-image can be avoided, resulting in an improved image quality.

In an advantageous development of the present disclosure the at least one distortion function is acquired using an S21-measurement whereby a transmission between an auxiliary antenna provided as a sender and the receiver part is measured in terms of amplitude and phase using a predetermined signal. The predetermined signal with a given amplitude, phase, and frequency can, in other words, be transmitted from the auxiliary antenna functioning as the sender to the receiver part to determine a frequency response or characteristic of at least the receiver part. A transmission characteristic and/or other parameters of the auxiliary antenna can be given, that is, determined prior to the transmission and provided as a parameter. An S21-measurement is an established technique in other technical fields and can therefore advantageously be easily adapted to the present disclosure. Using the S21-measurement provides an easy and reliable way to determine or acquire the at least one distortion function.

A further advantageous development of the present disclosure is characterised in that if over the whole k-space data acquisition for the respective MR-image a readout gradient is unchanged, then a preliminary MR-image is reconstructed from the image space data. The preliminary MR-image is then divided by the at least one distortion function to generate the compensated image space data as the MR-image. Here, the preliminary MR-image is the derived image space data. The unchanged or constant readout gradient, that is, its value used for acquiring the k-space data for the MR-image, can be determined during the acquisition of the k-space data, as well as beforehand or afterwards. In particular, the readout gradient can be determined for each individual measurement position or data point, since even if the readout gradient is the same for each partial acquisition, e.g. for each line of k-space data, the readout gradient can still vary spatially over an imaged section or volume. It is an insight of the present disclosure that only in comparatively relatively simple cases, where the readout gradient is identical of the entire k-space data acquisition, the frequency dependence, that is, the corresponding distortion of the MR-signal, i.e. the measured k-space data, can be corrected by dividing the reconstructed preliminary MR-image with the distortion function, if the used readout gradient or readout gradients are known, and according to each position. This is, however, the case for most Cartesian acquisitions. In these cases, the proposed method can be particularly easily applied or added to a conventional data acquisition and image reconstruction queue as a post-processing step. If, however, an MR imaging or pulse sequence is used in which the readout gradient differs between repetitions, for example between acquisitions of different lines of k-space data, another approach described below can be used more advantageously. Such sequences can include or use radial, spiral, EPI, and/or segmented acquisitions or acquisition patterns.

In an alternative further advantageous development of the present disclosure a readout gradient used for each partial acquisition of the k-space data is determined. The image space data is then divided by the at least one distortion function in dependence on the respective used readout gradient to generate the compensated image space data. The readout gradient can for example be determined with pixel grade precision or for each line of k-space data. One line of k-space data can be acquired in or with one partial acquisition, where multiple such partial acquisitions, that is, multiple lines of k-space data, make up the complete k-space data for the respective MR-image. The MR-image is then reconstructed based on or from the compensated image space data. This means that here the compensation or correction of the frequency dependence is done prior to reconstruction of the MR-image. This approach can be inserted as an additional processing step into pre-existing data acquisition and image reconstruction queues to improve the image quality of the resulting MR-image. Advantageously, this approach can eliminate the frequency dependence relatively early in the data acquisition and image reconstruction queue, in particular immediately after acquiring the k-space data. This can advantageously prevent any unwanted influences or effects of the frequency dependence further down the line in the queue. The method proposed here can preferably automatically be used when it is detected or determined that the readout gradient changes during acquisition of the k-space data for the MR-image. The change in the readout gradient can be detected during the acquisition, that is, as it is happening, or prior to the actual acquisition of the k-space data, for example based on a provided MR sequence to be used for the acquisition of the k-space data.

In a further advantageous development of the present disclosure prior to the reconstruction of the MR-image the compensated image space data is inversely Fourier transformed to k-space, that is, to the frequency domain, and provided as input to a pre-existing, i.e. conventional, image reconstruction queue. The additional step of Fourier back-transforming the image space data to k-space can on the hand side require additional computational resources but can on the other hand side advantageously enable the present disclosure to be integrated into existing conventional methods and devices very straightforward and easily. In particular, no change in data type has to be handled by the pre-existing image reconstruction queue. The pre-existing image reconstruction queue can be taken from the current state of the art or existing magnetic resonance imaging devices, and can comprise well-known steps to reconstruct an MR-image from k-space data. An advantage of implementing the method proposed here lies in the fact that the pre-existing image reconstruction queue then automatically uses k-space data that has been compensated or corrected for the frequency dependence, resulting in improved image quality.

To implement or realize the suggested approach, the initial frequency-dependent k-space can be acquired and written into a temporary k-space data storage matrix, and from there be Fourier transformed. After the resulting image space data has been compensated or corrected for the frequency dependence, the inversely Fourier transformed k-space data can then be written into a proper k-space data storage matrix, which can then be used as a starting point or source for the further image reconstruction process or queue.

In a further advantageous development of the present disclosure each line of the k-space data is Fourier transformed, frequency corrected using the division by the at least one distortion function, and then inversely Fourier transformed on its own as it is acquired. This means that the compensation of the frequency dependence can be done per line of k-space data, while still more of the k-space data, that is, additional lines of k-space data for the MR-image are acquired. Since in this manner the acquisition of the full set of k-space data does not have to be completed, for the compensation or correction of the frequency dependence to start, the complete process of acquiring the k-space data and performing the compensation for the frequency dependence and ultimately reconstructing and providing the MR-image can advantageously be sped up. If the same readout gradient is used for multiple consecutive lines of k-space data, these lines of k-space data can be grouped so that the compensation for the frequency dependence can be performed on them together, that is, at the same time. This can advantageously reduce a number of I/O-operations during data processing, and increase a computational efficiency while still speeding up the whole data acquisition and image reconstruction process.

In a further advantageous development of the present disclosure a magnetic field strength of a static magnetic field used during the acquisition of the k-space data for the respective MR-image is—preferably automatically—determined. The steps for compensating for the frequency dependence are then automatically only performed if the determined magnetic field strength is ≤1.5 T. This approach advantageously factors in the fact that the loss of image quality due to reduced bandwidth and corresponding frequency dependence is particularly relevant or pronounced at magnetic field strength below 1.5 T. Therefore, by automatically deciding to perform the frequency dependence correction or not based on the actually used magnetic field strength, an overall performance of the data acquisition and image reconstruction can be optimised without sacrificing image quality of a respective resulting MR-image. Furthermore, this approach enables the present disclosure to be implemented once, and then flexibly be used in or for different types of magnetic resonance imaging devices. The actual used magnetic field strength can be gathered automatically from the respective magnetic resonance imaging device or a provided sequence to be used or the acquired data as a parameter value, depending on where and if it is accessible or stored. The actual used magnetic field strength can also be provided as an input or parameter for the method according to the present disclosure, or a respective data processing device or computer program used to carry out this method.

Another aspect of the present disclosure is a magnetic resonance imaging device comprising acquisition means for acquiring at least one distortion function that describes or characterizes a frequency dependence of an amplitude and/or a phase of an MR-signal received or measured by a receiver part of the device. The magnetic resonance imaging device further comprises the receiver part adapted for measuring k-space data, and data processing means for automatically processing the k-space data and the acquired distortion function. The data processing means are adapted to, in particular automatically, Fourier transform the k-space data to image space data, to generate compensated image space data by compensating for the frequency dependence in the image space data by dividing the image space data or image space data derived therefrom in image space by the distortion function, and to provide the MR-image as the compensated image space data or reconstructed therefrom. The magnetic resonance imaging device can, in other words, be the magnetic resonance imaging device mentioned in conjunction with the method according to the present disclosure. The magnetic resonance imaging device according to the present disclosure can thus be adapted to, in particular automatically or semi-automatically, perform or carry out the method according to the present disclosure.

For this purpose, the magnetic resonance imaging device according to the present disclosure, in particular its data processing means, can comprise a computer readable storage medium having stored thereon a computer program or program code, which comprises instructions that, when the computer program or program code is executed by a computer, in particular by the magnetic resonance imaging device or its data processing means, cause the computer to carry out the steps of the method according to the present disclosure. To execute this computer program or program code, the respective computer, in particular, the magnetic resonance imaging device according to the present disclosure or its data processing means, can also comprise a processor or processing device, such as a microprocessor, a microchip, or microcontroller, connected to the computer readable storage medium and adapted to execute the computer program or program code stored thereon.

The mentioned computer program or program code encoding or representing the steps of the method according to the present disclosure as well as the mentioned computer readable storage medium are each on their own additional aspects of the present disclosure.

Another aspect of the present disclosure is a data carrier signal carrying the computer program according to the present disclosure.

The embodiments and developments of the present disclosure described herein for at least one aspect of the present disclosure, that is, at least for the method, the magnetic resonance imaging device, the computer program, and the computer-readable storage medium, as well as the corresponding advantages may be applied to any and all aspects of the present disclosure.

BRIEF DESCRIPTION OF THE FIGURES

Further advantages, features, and details of the present disclosure derive from the following description of preferred embodiments of the present disclosure as well as from the drawings pertaining to the present disclosure. The features and feature combinations previously mentioned in the description as well as the features and feature combinations mentioned in the following description of the figures and/or shown in the figures alone can be employed not only in the respectively indicated combination but also in other combinations or taken alone without leaving the scope of the present disclosure. In the drawings:

FIG. 2 schematically illustrated an example of a flow chart for a method for providing an MR-image with improved image quality;

DETAILED DESCRIPTION

The examples described below refer to preferred embodiments of the present disclosure. Therein, individual components and process steps of the embodiments each constitute individual, independent features of the present disclosure that can further develop the disclosure independently of each other as well as in combinations not explicitly described. The described embodiments can be further developed or supplemented by features, components and/or steps already described above.

Figure 1:
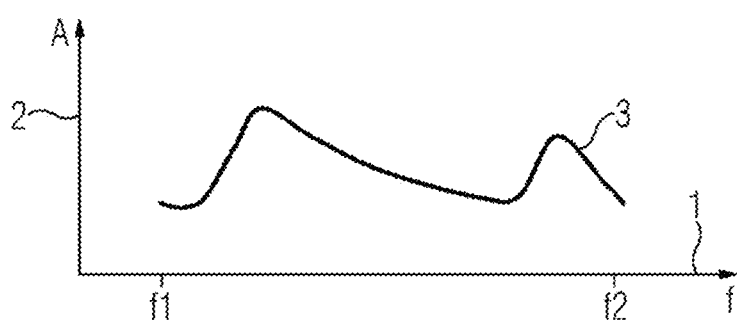
FIG. 1 schematically illustrates a frequency dependence of an amplitude of a received signal.
Figure 3:
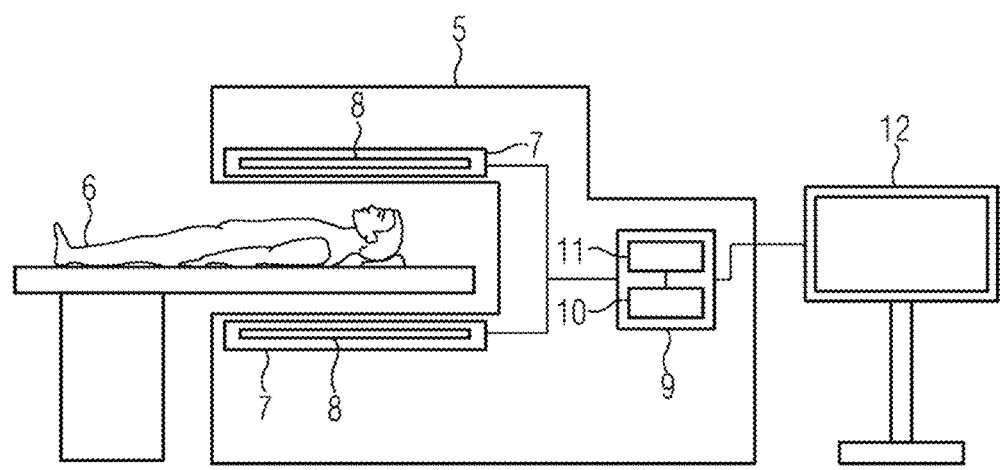
FIG. 3 schematically illustrates a magnetic resonance imaging device for carrying out the method illustrated in FIG. 2.

FIG. 1 schematically shows a diagram with x-axis 1, indicating a frequency f, and a y-axis 2 indicating an amplitude A. In this diagram, an MR-signal 3 is depicted. The amplitude A of the MR-signal 3 clearly varies in dependence on the frequency f and can therefore also be described as A(f). The MR-signal 3 can, for example be measured using a receiving antenna or coil of a magnetic resonance imaging device 5 (see FIG. 3) in response to a sent predetermined signal of known characteristics or during an acquisition of k-space data. In a similar fashion as depicted in FIG. 1 also a phase P of the MR-signal 3 can vary with the frequency f and therefore be written as P(f). The MR-signal 3 thus shows a frequency dependence in its amplitude and/or phase. This frequency dependence can be particularly pronounced for relatively low bandwidths of a transmitting system comprising a sending or transmitting part or coil (TX) and the receiving part or coil (RX), as is often the case for low field systems or low field magnetic resonance imaging devices, such as the magnetic resonance imaging device 5. A relatively low or small bandwidth means that frequencies f1 and f2 indicating lower and upper usable frequency limits for the MR-signal 3 are closer together than they would be for a high field system or device.

Since the frequency dependence of the MR-signal 3 can lead to lower image quality, correcting or compensating for this frequency dependence can correspondingly result in an improved image quality.

To this end, FIG. 2 schematically illustrates an example of a flow chart 4 for a method for providing an MR-image with improved image quality. This method can be carried out using the magnetic resonance imaging device 5 shown schematically in FIG. 3. The magnetic resonance imaging device 5 is adapted and configured to provide a magnetic resonance image, or MR-image for short, of a subject, in this case, for example of a part of a patient 6 placed in an imaging chamber of the magnetic resonance imaging device 5. The magnetic resonance imaging device 5 comprises a magnetic system 7 which in turn comprises multiple magnets, coils and the like, for generating a magnetic field in the imaging chamber, generating high-frequency or radio-frequency pulses, and to receive or measure the corresponding echoes, such as the MR-signal 3 or similar frequency dependent signals. Here, a receiving coil 8 for receiving the echoes is schematically indicated as part of the magnetic system 7. The magnetic system 7 is connected to a data processing device 9, which is configured to process any MR-signal that is measured by the receiving coil 8 and any k-space data carried by these MR-signals. The data processing device 9 comprises a computer readable storage medium 10 and a processor 11 connected thereto. The storage medium 10 presently contains a computer program comprising instructions which, when the computer program is executed by the processor, 11, cause the data processing device 9 or the magnetic resonance imaging device 5 to carry out the steps of the method according to the flow chart 4. This means that process steps S1 to S15 as well as program paths P1 to P6 of the flowchart 4 can be or represent modules, functions, or functional blocks of the above-mentioned computer program.

Presently, the magnetic resonance imaging device 5 also comprises a display device 12 connected to the data processing device 9 and configured to display an MR-image generated and provided by the magnetic resonance imaging device 5, in particular by the data processing device 9.

In a process step S1 it is, preferably automatically, determined, if the magnetic resonance imaging device 5 is a low field system using a static magnetic field strength of 1.5 T or less or if it is currently configured to use or generate a static magnetic field strength of 1.5 T or less for a current application or acquisition. If this is not the case, meaning that the magnetic resonance imaging device 5 is or is configured as a high field system with a static magnetic field strength of more than 1.5 T, the method or program can follow a program path P1 and end in a process step S2. This means that for high field systems, devices, or applications, the compensation or correction of the frequency dependence can be foregone. This is, however, optional, meaning that even for high field systems or applications as well as for low field systems or applications the method or program can follow an alternative program path P2 to actually carry out the frequency dependence correction or compensation.

In this case, in a process step S3 the distortion functions A(f) and P(f) for the magnetic resonance imaging device 5 and in particular for the receiving coil 8 are acquired or determined.

In a process step S4 it is, in particular automatically, determined if a current or planned acquisition or acquisition sequence uses just one fixed readout gradient or demands a change in the readout gradient during the k-space data acquisition or between different partial k-space data acquisitions.

If only one fixed readout gradient is used, then the method or program follows a program path P3 to a process step S5. In the process step S5 the k-space data for the planned MR-image is acquired and filled into a corresponding storage matrix.

Once this storage matrix is filled, meaning that all the required k-space data for the planned MR-image is acquired, the required k-space data is Fourier transformed to image space, that is, into image space data, in a process step S6.

In a process step S7 a preliminary MR-image is then reconstructed from this image space data, for example, using standard image reconstruction techniques.

In a process step S8 the preliminary MR-image, that is, its data, is then divided by the distortion functions A(f), P(f) to correct for the frequency dependence or frequency characteristic of the corresponding data or of the receiving coil 8. This results in the final corrected MR-image, which in a process step S9 is then output as a result of the data acquisition and image reconstruction process. For example, the final corrected MR-image can be displayed on the display device 12.

If, however, in process step S4 it is determined that the readout gradient, for example its strength and/or direction, changes during acquisition of the complete set of k-space data for the planned MR-image, instead of following the program path P3 the method or program then follows a program path P4 to a process step S10.

Figure 4:
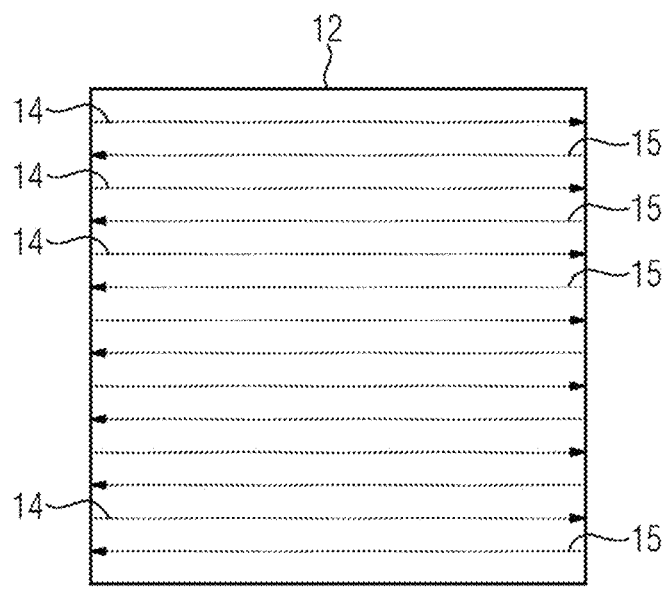
FIG. 4 schematically illustrates a k-space data acquisition scheme with changing readout directions for each line of the k-space.

As an example, FIG. 4 schematically illustrates a k-space data acquisition scheme or sampling pattern, wherein a k-space 13 is sampled, line by line with a readout direction being inverted after the acquisition of each k-space line. This means that for every other k-space line the same readout direction and readout gradient can be used. As an example, even k-space lines 14, some of which are indicated here, all are acquired with a readout direction from left to right. Even k-space lines 15, some of which are also indicated here, are acquired using the opposite readout direction from right to left. Therefore, the readout gradient is inverted after the acquisition of each k-space line 14, 15 and therefore the distortion functions A(f), P(f) in image space are changed with every partial acquisition, that is, after each acquisition of one of the k-space lines 14, 15.

In the process step S10 a partial k-space data acquisition is performed, meaning that one line of k-space data is acquired and filled into a temporary k-space storage matrix. Depending on an acquisition scheme filling this temporary k-space can comprise gridding, for example, in case of ramp sampling.

The line of k-space data acquired in process step S10 is in a following process step S11 then Fourier transformed to the spatial domain, that is, into image space data. In the special case of a spiral acquisition or sampling scheme, non-uniform fast Fourier transform (NU-FFT) and be used.

In a process step S12 compensated image space data is generated by dividing the image space data by the known distortion functions A(f), P(f) according to the readout gradient used for the current acquisition and a respective pixel position to correct or compensate for the frequency dependence.

In a process step S13 this compensated image space data is then Fourier back-transformed, that is, inversely Fourier transformed, to k-space and filled into a proper k-space storage matrix.

In a process step S14 it is checked or determined, if the k-space data acquisition for the planned MR-image is complete, which can for example, be indicated by the proper k-space storage matrix being fully populated with acquired k-space data. If this is not the case, then the method or program follows a program path P5 back to the process step S10 to acquire the next line of k-space data. The process starting from S10 is, in other words, repeated for each partial acquisition during the measurement for the planned MR-image. This only indicates the idea of sequential, line-wise data acquisition and processing. In practice, a respective next iteration of the process step S10, that is, acquisition of the next line of the k-space data, may already be performed, while for example process step S13 is still being carried out for the respective previously acquired line of k-space data.

If the acquisition of the k-space data is complete, the method or program follows a program path P6 to a process step S15. In the process step S15 the final MR-image is reconstructed from the proper k-space data storage matrix, which contains k-space data that has already been corrected in terms of the undesirable frequency dependence.

Just as the process step S7, the process step S15 can be carried out using standard image reconstruction techniques. Also, process steps S7 and/or S15 may comprise additional operations, such as for example, filtering, noise reduction, artefact correction, and the like.

After the final corrected MR-image is reconstructed in the process step S15, it is also output in the process step S9, for example to the display device 12.

In summary, a generic correction algorithm is proposed that can be applied to measured data before or after filling those data into a k-space storage matrix for reconstruction. The described examples illustrate how a correction of in-band signal variations can be realised to achieve an improved image quality in a resulting MR-image.

The invention claimed is:
1. A method for providing an MR-image, comprising:
acquiring at least one distortion function that describes a frequency dependence of an amplitude or of a phase of an MR-signal received by a receiver part of an MRI-device;
acquiring k-space data measured using the receiver part;
Fourier transforming the k-space data to image space data;
generating compensated image space data by compensating for the frequency dependence in the image space data by dividing the image space data or image space data derived therefrom in image space by the distortion function; and
providing the MR-image as the compensated image space data or reconstructed therefrom.

2. The method according to claim 1, wherein the at least one distortion function is acquired by an S21-measurement, whereby a transmission between an auxiliary antenna provided as a sender and the receiver part is measured in terms of amplitude and phase using a predetermined signal.

3. The method according to claim 1, further comprising, if over the whole k-space data acquisition for the respective MR-image a readout gradient is unchanged:
reconstructing a preliminary MR-image from the image space data; and
dividing the preliminary MR-image by the at least one distortion function to generate the compensated image space data as the MR-image.

4. The method according to claim 1, further comprising:
determining a readout gradient used for each partial acquisition of the k-space data;
dividing the image space data by the at least one distortion function in dependence on the respective used readout gradient to generate the compensated image space data; and
reconstructing the MR-image based on the compensated image space data.

5. The method according to claim 4, prior to the reconstruction of the MR-image, further comprising:
inverse Fourier transforming the compensated image space data to k-space; and
providing the inverse Fourier transformed k-space image as input to a pre-existing image reconstruction queue.

6. The method according to claim 5, wherein each line of the k-space data is Fourier trans-formed, frequency corrected by means of the division by the at least one distortion function, and inversely Fourier transformed on its own as it is acquired.

7. The method according to claim 1, further comprising:
determining a magnetic field strength of a static magnetic field used during the acquisition of the k-space data for the respective MR-image,
wherein the steps for compensating for the frequency dependence are automatically only performed if the determined magnetic field strength is ≤1.5 T.

8. A magnetic resonance imaging device, comprising:
an acquirer configured to acquire at least one distortion function that describes a frequency dependence of an amplitude or of a phase of an MR-signal (received by a receiver part of the magnetic resonance imaging device;
the receiver part configured to measure k-space data; and
a data processor configured to automatically process the k-space data and the acquired distortion function, the data processor being configured:
to Fourier transform the k-space data to image space data,
to generate compensated image space data by compensating for the frequency dependence in the image space data by dividing the image space data or image space data derived therefrom in image space by the distortion function, and to provide the MR-image as the compensated image space data or reconstructed therefrom.

9. A non-transitory computer-reader medium having a computer program comprising instructions which, when the computer program is executed by a magnetic resonance imaging device having an acquirer configured to acquire at least one distortion function that describes a frequency dependence of an amplitude or of a phase of an MR-signal received by a receiver part of the magnetic resonance imaging device, the receiver part configured to measure k-space data, a data processor configured to automatically process the k-space data and the acquired distortion function, the data processor being configured to Fourier transform the k-space data to image space data, to generate compensated image space data by compensating for the frequency dependence in the image space data by dividing the image space data or image space data derived therefrom in image space by the distortion function, and to provide the MR-image as the compensated image space data or reconstructed therefrom, cause the magnetic resonance imaging device to carry out the steps of the method according to claim 1.

* * * * *